United States Patent
Ruelke et al.

(10) Patent No.: US 10,263,636 B2
(45) Date of Patent: Apr. 16, 2019

(54) SCALABLE DYNAMIC RANGE ANALOG-TO-DIGITAL CONVERTER SYSTEM

(71) Applicant: MOTOROLA SOLUTIONS, INC., Chicago, IL (US)

(72) Inventors: Charles R. Ruelke, Coral Springs, FL (US); Joshua E. Dorevitch, Yad Binyamin (IL); Nir Corse, Rishon Le-Zion (IL)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 15/616,674

(22) Filed: Jun. 7, 2017

(65) Prior Publication Data

US 2018/0358980 A1 Dec. 13, 2018

(51) Int. Cl.
*H04B 1/38* (2015.01)
*H03M 3/00* (2006.01)
*H03G 3/20* (2006.01)
*H03G 3/00* (2006.01)
*H04W 52/02* (2009.01)

(52) U.S. Cl.
CPC ............ *H03M 3/488* (2013.01); *H03G 3/008* (2013.01); *H03G 3/20* (2013.01); *H04W 52/0238* (2013.01)

(58) Field of Classification Search
CPC ......... H03M 3/488; H03G 3/008; H03G 3/20; H04W 52/0238
See application file for complete search history.

(56) References Cited

U.S. PATENT DOCUMENTS

| | | | |
|---|---|---|---|
| 6,134,430 A | 10/2000 | Younis et al. | |
| 6,538,592 B1 | 3/2003 | Yang et al. | |
| 6,765,517 B1 | 7/2004 | Ali | |
| 2002/0105449 A1* | 8/2002 | Schreier | H03M 3/482 341/139 |
| 2010/0103003 A1* | 4/2010 | Deval | H03M 3/33 341/118 |
| 2011/0130176 A1* | 6/2011 | Magrath | G10K 11/178 455/570 |
| 2016/0014366 A1* | 1/2016 | Chiaverini | H04N 5/378 348/300 |
| 2016/0344289 A1* | 11/2016 | Kris | H02M 1/08 |

* cited by examiner

*Primary Examiner* — Xin Jia
(74) *Attorney, Agent, or Firm* — Michael Best & Friedrich LLP

(57) ABSTRACT

A scalable dynamic range analog-to-digital converter. In one instance, a method of scaling a dynamic range of an analog-to-digital converter is provided. The method includes operating the analog-to-digital converter at a first dynamic range. The method also includes receiving a radio frequency signal and detecting an on-channel signal level of the radio frequency signal. The method also includes when the on-channel signal level is above an on-channel threshold, operating the analog-to-digital converter at a second dynamic range. The method also includes when the on-channel signal level is below the on-channel threshold, operating the analog-to-digital converter at the first dynamic range.

18 Claims, 4 Drawing Sheets

SCALABLE DYNAMIC RANGE ANALOG-TO-DIGITAL CONVERTER SYSTEM

BACKGROUND

Mobile communication devices such as smart telephones, land mobile radios, and the like may need high dynamic range analog-to-digital converters to receive weak signals when strong interference signals are present. Generally, high dynamic range analog-to-digital converters require large amounts of power. As a consequence, this type of analog-to-digital converter affects battery life and strong signal spur mitigation of the mobile communication devices.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed subject matter, and explain various principles and advantages of those embodiments.

Figure 1:
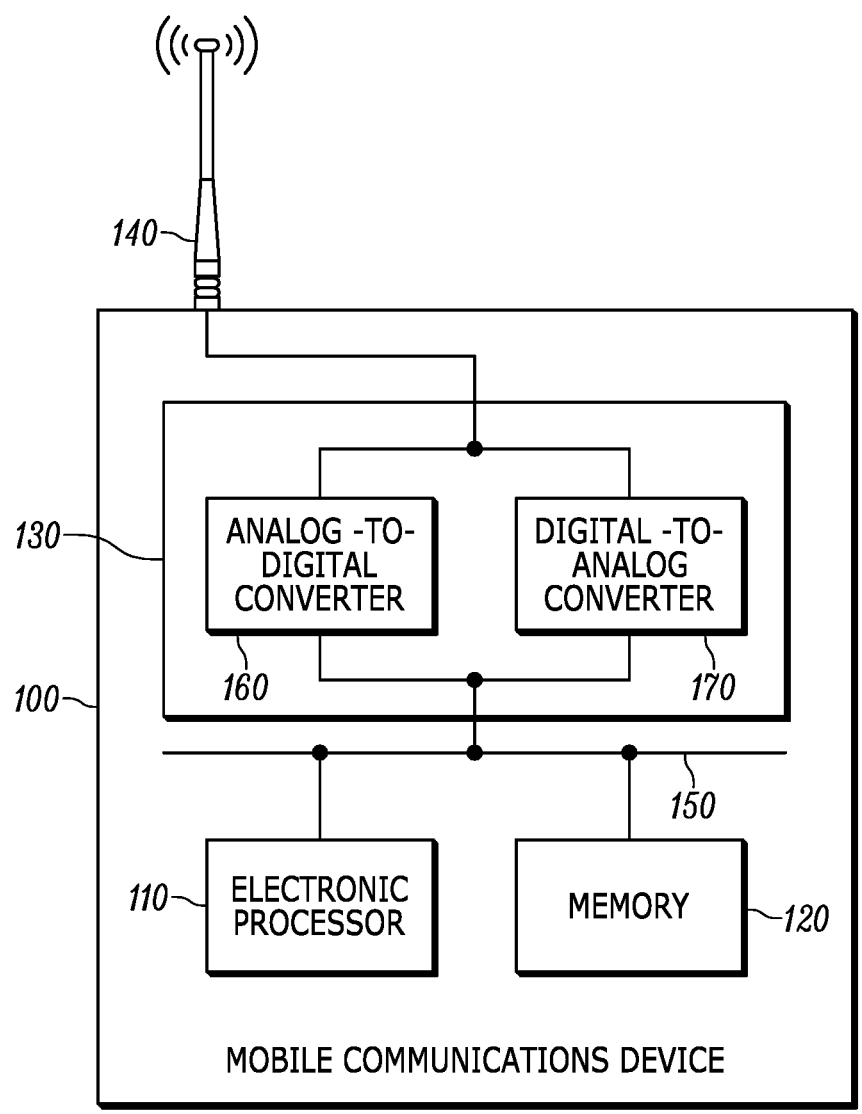
FIG. 1 is a diagram of a mobile communications device in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments.

The apparatus and method components have been represented where appropriate by conventional symbols in the drawings, showing only those specific details that are pertinent to understanding embodiments and so as not to obscure the disclosure with details that will be readily apparent to those of ordinary skill in the art having the benefit of the description herein.

DETAILED DESCRIPTION OF THE INVENTION

Analog-to-digital converters may include switched capacitor sigma-delta modulators that convert analog signals received at an antenna of the mobile communications device to digital signals. The capacitors in switched capacitor sigma-delta modulators are often a source of thermal noise, which is often represented or modelled using the relationship kT/C, where k is Boltzmann's constant in joules per Kelvin, T is absolute temperature, and C is the capacitance in farads). In order to achieve high dynamic range and low switching noise, sigma-delta modulators often incorporate large capacitors. To charge and discharge these large capacitors at a high clock rate, high speed clocks and operational amplifiers that require higher current are used. As a consequence, high dynamic range analog-to-digital converters reduce battery life.

However, high dynamic range is not always necessary. Advancements in networks (for example, an increased number of base stations) has improved network coverage and decreased the likelihood of receiving a weak signal. As a consequence, analog-to-digital converters need not operate at high-dynamic range when the mobile communications device receives relatively strong signals.

One embodiment provides a scalable dynamic range analog-to-digital converter including a switched capacitor sigma-delta modulator. The sigma-delta modulator includes a first capacitor having a first capacitance value and a second capacitor having a second capacitance value. The analog-to-digital converter also includes a receiver electronic processor that controls a switching operation of the switched capacitor sigma-delta modulator and receives an on-channel signal level of an on-channel signal. The receiver electronic processor switches in the first capacitor when the on-channel signal level is below an on-channel threshold. The receiver electronic processor switches in the second capacitor when the on-channel signal level is above the on-channel threshold.

Another embodiment provides a mobile communications device including an internal antenna receiving a radio frequency (RF) signal and an on-channel detector coupled to the internal antenna. The on-channel detector is configured to detect an on-channel signal level of the radio frequency signal. The mobile communications device also includes an analog-to-digital converter coupled to the internal antenna to convert the radio frequency signal to a digital signal and includes a switched capacitor sigma-delta modulator. The sigma-delta modulator includes a first capacitor having a first capacitance value and a second capacitor having a second capacitance value. The mobile communications device also includes a receiver electronic processor that controls a switching operation of the switched capacitor sigma-delta modulator, wherein the receiver electronic processor switches in the first capacitor when the on-channel signal level is below an on-channel threshold. The receiver electronic processor switches in the second capacitor when the on-channel signal level is above the on-channel threshold.

Another embodiment provides a method of scaling a dynamic range of an analog-to-digital converter. The method includes operating the analog-to-digital converter at a first dynamic range. The method also includes receiving a radio frequency signal and detecting an on-channel signal level of the radio frequency signal. The method also includes when the on-channel signal level is above an on-channel threshold, operating the analog-to-digital converter at a second dynamic range. The method also includes when the on-channel signal level is below the on-channel threshold, operating the analog-to-digital converter at the first dynamic range.

FIG. 1 is a diagram of one embodiment of a mobile communications device 100. The mobile communications device 100 may be a mobile, a portable or a handset device including, for example, a two-way radio, a vehicle mounted two-way radio, a smart telephone, a tablet computer, or the like. In the example illustrated, the mobile communications device 100 includes an electronic processor 110, a memory 120, a transceiver 130, and an antenna 140. The electronic processor 110, the memory 120, and the transceiver 130 communicate over one or more control and/or data buses (for example, a communication bus 150). FIG. 1 illustrates only one exemplary embodiment of a mobile communications device 100. The mobile communications device 100 may include more or fewer components and may perform functions other than those explicitly described herein.

In some embodiments, the electronic processor 110 is implemented as a microprocessor with separate memory, such as the memory 120. In other embodiments, the electronic processor 110 may be implemented as a microcontroller (with memory 120 on the same chip). In other embodiments, the electronic processor 110 may be implemented using multiple processors. In addition, the electronic processor 110 may be implemented partially or entirely as, for example, a field programmable gate array (FPGA), and application specific integrated circuit (ASIC), and the like and the memory 120 may not be needed or be modified accordingly. In the example illustrated, the memory 120 includes non-transitory, computer-readable memory that stores instructions that are received and executed by the electronic processor 110 to carry out the functionality of the mobile communications device 100 described herein. The memory 120 may include, for example, a program storage area and a data storage area. The program storage area and the data storage area may include combinations of different types of memory, such as read-only memory and random-access memory.

The transceiver 130 enables wireless communication from the mobile communications device 100 to, for example, other mobile communications devices 100, a call controller, or other electronic devices. The transceiver 130 is coupled to an antenna 140 to receive and send communication signals. The antenna 140 may be, for example, an internal antenna of the mobile communications device 100 or an external antenna connected to the mobile communications device 100. The transceiver 130 communicates through the antenna 140 to at least one of a plurality of wireless radio frequency (RF) channels of certain bandwidth and having protocol compliance so as to transmit and/or receive on-channel communication signals as may be modulated onto a radio frequency carrier signal. The transceiver 130 includes an analog-to-digital converter 160 in a receiver portion of the transceiver 130 to convert received analog signals from the antenna 140 to digital signals to be transmitted to the components of the mobile communications device 100. The transceiver 130 also includes a digital-to-analog converter 170 in a transmitter portion of the transceiver 130 to convert digital signals received from the components of the mobile communications device 100 to analog signals to be transmitted from the antenna 140. In other embodiments, rather than the transceiver 130, the mobile communications device 100 may include separate transmitting and receiving components, for example, a transmitter and a receiver.

Figure 2:
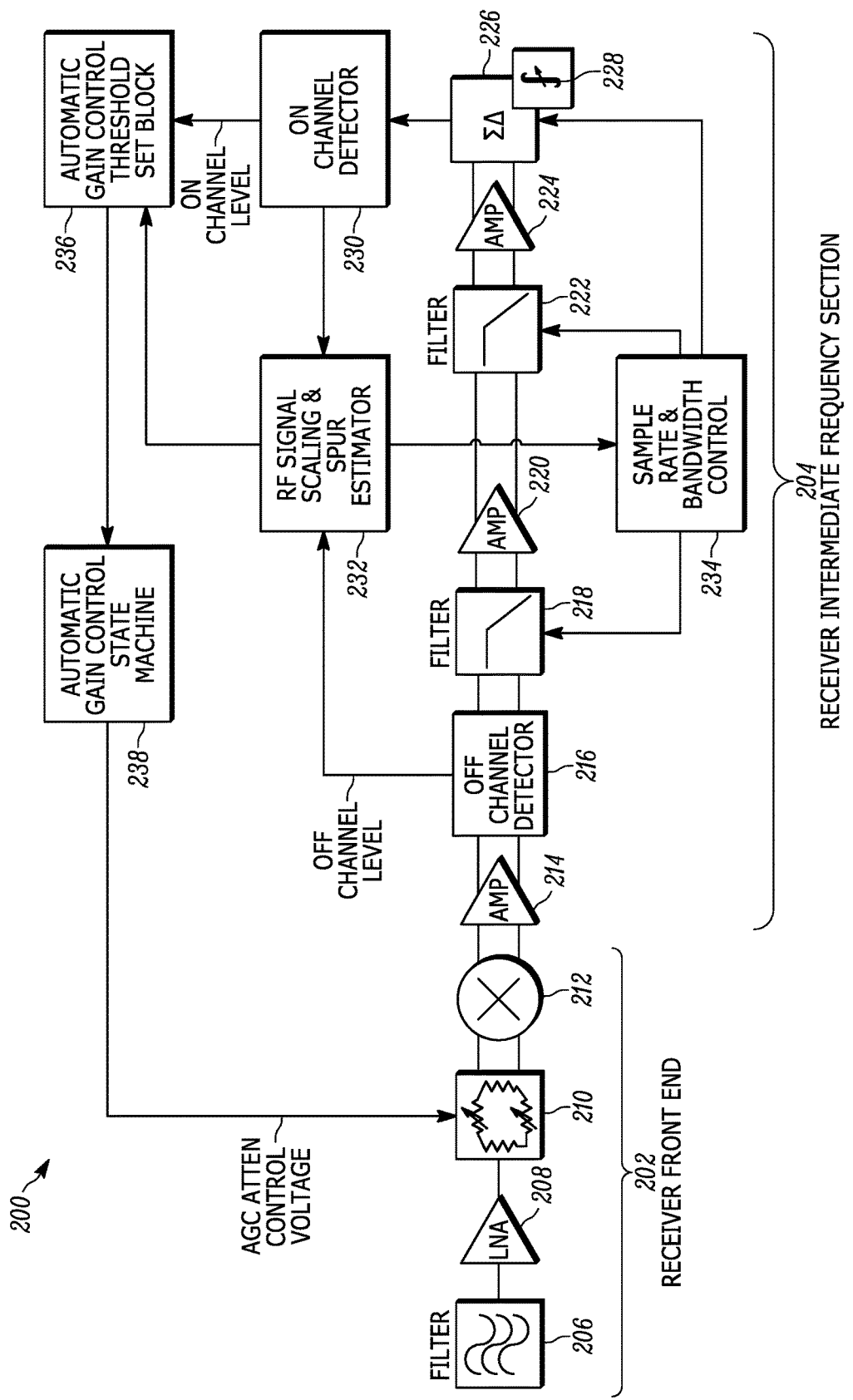
FIG. 2 is a simplified block diagram of a portion of a transceiver of the mobile communications device of FIG. 1 in accordance with some embodiments.

FIG. 2 is a simplified block diagram of one embodiment of a receiver portion 200 of the transceiver 130 incorporating a scalable dynamic range analog-to-digital converter 160. The analog-to-digital converter 160 receives analog radio frequency (RF) signals from the antenna 140 and converts the analog signal to digital signals. In the example illustrated, the receiver portion 200 includes a receiver front end 202 and a receiver intermediate frequency section 204. The receiver front end 202 may be partly provided in the antenna 140 and receives the radio frequency signals from a base station. The receiver front end 202 includes a filter 206, a low-noise amplifier 208, a quadrature splitter 210, and a mixer 212.

The antenna 140 receives the radio frequency signals and filters and conditions them with the filter 206 and the low-noise amplifier 208. The filtered radio frequency signals are then provided to the quadrature splitter 210, which splits the filtered radio frequency signals into in-phase and quadrature components by means of, for example, quadrature mixers. The in-phase and the quadrature components are then provided to the receiver intermediate frequency section 204.

The receiver intermediate frequency section 204 includes a first amplifier 214, an off-channel detector 216, a first low-pass filter 218, a second amplifier 220, a second low-pass filter 222, a third amplifier 224, a sigma-delta modulator 226 including an integrator 228, an on-channel detector 230, a RF signal scaling and spur estimator 232, a sample rate and bandwidth controller 234, an automatic gain control threshold set block 236, and an automatic gain control state machine 238. In some embodiments, the sigma-delta modulator 226 and the integrator 228 are part of the analog-to-digital converter 160. In some embodiments, the analog-to-digital converter 160 may also additionally include the second low-pass filter 222, the third amplifier 224, the RF signal scaling and spur estimator 232, the sample rate and bandwidth controller 234, or the automatic gain control threshold set block 236.

The received radio frequency signal may include both an on-channel signal and an off-channel signal. The on-channel signal is the desired signal of the mobile communications device 100, for example, signal within the operating frequency or band of the mobile communications device 100 and directed to the mobile communications device 100. The off-channel signal may be out-of-band or undesired signals or signals not directed to the mobile communications device 100 that may arise from an interference or noise source.

The in-phase and quadrature components are provided to the off-channel detector 216 after passing through the mixer 212 and the first amplifier 214 (for example, a transimpedance amplifier). The off-channel detector 216 may detect the power level, strength, quality, range, and the like of the off-channel signal (or noise) (for example, off-channel signal profile). The off-channel detector 216 provides the off-channel signal profile information to the RF signal scaling and spur estimator 232.

The in-phase and quadrature components are then provided to the sigma-delta modulator 226 after passing through the first low-pass filter 218 (for example, a one-pole low-pass filter), the second amplifier 220, the second low-pass filter 222 (for example, a two-pole filter), and the third amplifier 224. The sigma-delta modulator 226 converts the in-phase and quadrature components into digital signals that can be used by the components of the mobile communications device 100. Although the analog-to-digital converter 160 is shown including a single sigma-delta modulator 226, the sigma-delta modulator 226 may be implemented as a plurality of sigma-delta modulators 226 as may be needed to appropriately sample the on-channel signal. For example, the analog-to-digital converter 160 may include two sigma-delta converters to sample the in-phase component and the quadrature component respectively. The output of the plurality of sigma-delta modulators 226 may be combined to provide a sample representation of the on-channel signal to the on-channel detector 230 and other components of the mobile communications device 100.

The on-channel detector 230 is connected to the sigma-delta modulator 226 to detect the power level, strength, quality or the like of the on-channel signal (for example, on-channel signal level). The on-channel detector 230 provides the on-channel signal level information to the RF signal scaling and spur estimator 232 and the automatic gain control threshold set block 236.

The RF signal scaling and spur estimator 232 receives the on-channel signal level and the off-channel signal profile and provides scaled thresholds (for example, on-channel thresholds) to the automatic gain control threshold set block 236 and thereby to the automatic gain control state machine 238. The RF signal scaling and spur estimator 232 may set the scaled thresholds based on the on-channel signal level and the off-channel signal profile. The scaled thresholds may include various step sizes and levels based on the received signals. For example, the RF signal scaling and spur estimator 232 may set a higher step size when the RF signal scaling and spur estimator 232 detects that there is high level of noise based on the off-channel signal profile and may set a lower step size when the RF signal scaling and spur estimator 232 detects that there is a low level of noise based on the off-channel signal profile.

The automatic gain control threshold set block 236 receives the on-channel signal level and the scaled threshold and may determine whether the on-channel signal level is above or below the scaled threshold. In some embodiments, the automatic gain control threshold set block 236 may be controlled by the RF signal scaling and spur estimator 232 or may be implemented in the RF signal scaling and spur estimator 232.

The sample rate and bandwidth controller 234 controls the sample rate at which the sigma-delta controller samples the on-channel signal (for example, the in-phase and quadrature components) based on the on-channel signal level and threshold information received from the RF signal scaling and spur estimator 232. In addition, the sample rate and bandwidth controller 234 also controls the dynamic range of the sigma-delta modulator 226 based on the on-channel signal level and threshold information received from the RF signal scaling and spur estimator 232. The sample rate and bandwidth controller 234 also controls the first low-pass filter 218 and the second low-pass filter 22 based on the information received from the RF signal scaling and spur estimator 232. In some embodiments, the sample rate and bandwidth controller 234 receives control signals from the automatic gain control state machine 238 or the RF signal scaling and spur estimator 232 to change the sample rate and dynamic range of the sigma-delta modulator 226. In some embodiments, the sample rate and bandwidth controller 234 is implemented in the RF signal scaling and spur estimator 232.

The automatic gain control state machine 238 receives the on-channel signal level and off-channel signal profile information and automatically sets the gain of the antenna 140. The automatic gain control state machine 238 provides automatic gain control attenuation control voltage to the quadrature splitter 210. The quadrature splitter 210 splits the received radio frequency signal into in-phase and quadrature components based on the control voltage received from the automatic gain control state machine 238. In some embodiments, the automatic gain control state machine 238 is configured to set the dynamic range of the sigma-delta modulator 226.

The automatic gain control state machine 238, and accordingly the receiver portion 200, may include, for example, n states corresponding to n−1 on-channel thresholds. The automatic gain control state machine 238, therefore, adjusts the gain of the receiver portion 200 based on the on-channel signal level. Each of then states may have different update rates, or threshold step sizes. As described above, the RF signal scaling and spur estimator 232 sets the n−1 thresholds of the receiver portion 200 based on the on-channel signal profile and off-channel signal profile. For simplicity, the methods in the present disclosure are described with respect to two states (for example, high dynamic range and low dynamic range) and including a single on-channel threshold. However, it will be apparent that the receiver portion 200, the automatic gain control state machine 238, and the analog-to-digital converter 160 may include different number of states and thresholds.

In some embodiments, the RF signal scaling and spur estimator 232, the sample rate and bandwidth controller 234, and/or the automatic gain control threshold set block 236 are functional blocks that are implemented on a task-specific state machine, a separate processor (for example, an application specific integrated circuit) of the receiver portion 200, the electronic processor 110, or the like. Therefore, the functional blocks of the RF signal scaling and spur estimator 232, the sample rate and bandwidth controller 234, and/or the automatic gain control threshold set block 236 are together referred to as a receiver electronic processor. As described above with respect to the electronic processor 110, the receiver electronic processor may be implemented with a separate memory or a memory (for example, a receiver memory) included on the same chip. The receiver memory may store a decision matrix, a look-up table, or the like that allows the RF signal scaling and spur estimator 232 to set the on-channel thresholds based on the on-channel signal profile and the off-channel signal profile.

FIG. 2 illustrates only one exemplary embodiment of the analog-to-digital converter 160. The analog-to-digital converter 160 may include more of fewer components than illustrated and may perform additional functions other than those described herein.

Figure 3:
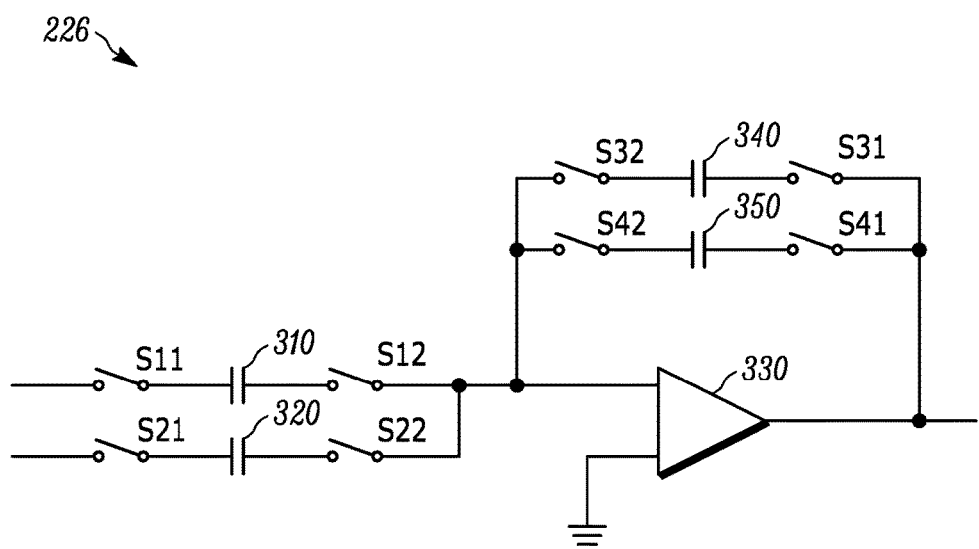
FIG. 3 is a simplified diagram of a sigma-delta modulator of the analog-to-digital converter of FIG. 2 in accordance with some embodiments.

FIG. 3 is a simplified diagram of one embodiment of an integrator 228 of the sigma-delta modulator 226. In the example illustrated, the sigma-delta modulator 226 is a switched capacitor sigma-delta modulator and includes a first input capacitor 310, a second input capacitor 320, an integrating amplifier 330, a first feedback capacitor 340, and a second feedback capacitor 350. The integrating amplifier 330, the first feedback capacitor 340, and the second feedback capacitor 350 may form the integrator 228 of the analog-to-digital converter 160. In addition, the first input capacitor 310 and the first feedback capacitor 340 may together or individually be referred to as the first capacitor and the second input capacitor 320 and the second feedback capacitor 350 may together or individually be referred to as the second capacitor. FIG. 3 illustrates only one exemplary partial embodiment of a first stage of the sigma-delta modulator 226. The sigma-delta modulator 226 may include more of fewer components than illustrated and may perform additional functions other than those described herein. For example, the sigma-delta modulator 226 may include additional input capacitors and feedback capacitors to correspond to the multiple states of the receiver. These multiple capacitors may be selected based on the requirements of the receiver portion 200.

Analog input $V_{AI}$ is provided to sigma-delta modulator 226 from the antenna 140. The analog input $V_{AI}$ is provided to the first input capacitor 310 and the second input capacitor 320 through switches S11 and S21 respectively. Outputs of the first input capacitor 310 and the second input capacitor 320 are provided to the integrating amplifier 330 through switches S12 and S22 respectively. The first input capacitor 310 samples the analog input $V_{AI}$ when the switch S11 is closed and discharges onto the integrating amplifier 330 when the switch S12 is closed. Similarly, the second input capacitor 320 samples the analog input $V_{AI}$ when the switch S21 is closed and discharges onto the integrating amplifier 330 when the switch S22 is closed.

The integrating amplifier 330 integrates the sampled input $V_{AI}$ from either the first input capacitor 310 or the second input capacitor 320 and outputs a digital signal VDO. The first feedback capacitor 340 may be connected between the input and the output of the integrating amplifier 330 by switches S31 and S32. Similarly, the second feedback capacitor 350 may be connected between the input and the output of the integrating amplifier 330 by switches S41 and S42.

The first input capacitor 310 and the first feedback capacitor 340 may have a higher capacitance value (for example, first capacitance value) than the capacitance value (for example, second capacitance value) of the second input capacitor 320 and the second feedback capacitor 350. The sigma-delta modulator 226 may include several input capacitors and feedback capacitors to allow for scaling over a wide array of dynamic ranges of the analog-to-digital converter 160.

Figure 4:
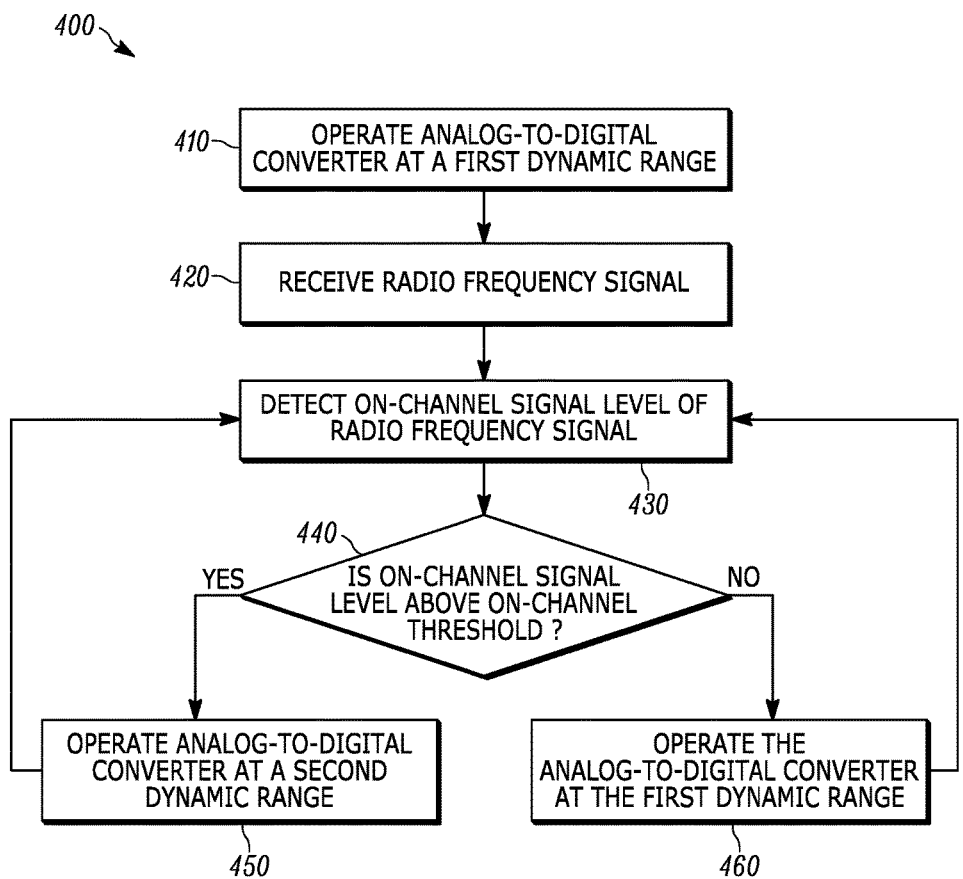
FIG. 4 is a flowchart of a method of scaling a dynamic range of the analog-to-digital converter of FIG. 2 in accordance with some embodiments.

FIG. 4 is a flowchart illustrating one example method 400 of scaling a dynamic range of the analog-to-digital converter 160. For simplicity, the method 400 is described with respect to two states: (i) a first dynamic range (that is, a high dynamic range); and (ii) a second dynamic range (that is, a low dynamic range). As illustrated in FIG. 4, the method 400 includes causing the analog-to-digital converter 160 to operate at the first dynamic range (at block 410). Because the mobile communications device 100 is not aware of the signal strength available at a startup, it may be advantageous to set the analog-to-digital converter 160 to operate at a high dynamic range. That is, a default configuration of the analog-to-digital converter 160 is a high dynamic range. Operating the analog-to-digital converter 160 at a high dynamic range includes switching in, using the sample rate and bandwidth controller 234, capacitors having higher capacitance values (that is, the first capacitor) into the sigma-delta modulator 226. When capacitors with higher capacitance are used in the sigma-delta modulator 226, the sigma-delta modulator 226 has higher signal-to-noise ratio and lower integration noise. In addition, operating the analog-to-digital converter 160 at a high dynamic range may also include increasing the reference voltage and sample rate of the sigma-delta modulator 226. In addition, the automatic gain control state machine 238 may adjust the gain of the receiver portion 200 such that the attenuation level of a received radio frequency level is in proportion to the first dynamic range. When the analog-to-digital converter 160 operates at a higher dynamic range, the receiver portion 200 or the antenna 140 of the mobile communications device 100 has higher sensitivity. In some embodiments, the automatic gain control state machine 238 may increase the bias current applied to the amplifiers 208, 214, 220, 224 (for example, an amplifier) when larger capacitors (for example, the first capacitor) are used in the sigma-delta modulator 226. In other words, when the first capacitor is switched in to the sigma-delta modulator 226, the automatic gain control state machine 238 adjusts the bias current of the amplifier 208, 214, 220, 224 in proportion to the first capacitance value.

The method 400 also includes receiving the radio frequency signal at the antenna 140 (at block 420). As described above, the radio frequency signal is received at the antenna 140 and split into an in-phase component and a quadrature component. The in-phase and quadrature components are then provided to the sigma-delta modulator 226.

The method 400 further includes detecting an on-channel signal level of the received radio frequency signal (at block 430). As described above, the on-channel detector 230 connected to the sigma-delta modulator 226 receives the on-channel signal of the radio frequency signal and determines a power level, quality or the like of the on-channel signal. In some embodiments, the analog-to-digital converter 160 may also detect an off-channel signal profile of the radio frequency signal. As described above, an off-channel detector 216 receives the radio frequency signal and determines the off-channel signal profile such as a power level, frequency range, and the like of the off-channel signal. In some embodiments, the off-channel detector 216 may also estimate a peak-to-average power ratio of the off-channel signal and may correlate the peak-to-average power ratio to the dynamic range of the analog-to-digital converter 160.

The method 400 also includes determining whether the on-channel signal level is above an on-channel threshold (at block 440). The receiver electronic processor generates a scaled threshold (that is, the on-channel threshold) and determines whether the on-channel signal level is above or below the on-channel threshold. As described above, in some embodiments, the automatic gain control threshold set block 236 may generate a plurality of thresholds and may compare the on-channel signal level to the plurality of thresholds.

The method 400 also includes when the receiver electronic processor determines that the on-channel signal level is above the on-channel threshold, operating the analog-to-digital converter 160 at the second dynamic range (at block 450). For example, when the receiver electronic processor determines that the on-channel signal is strong, the analog-to-digital converter 160 operates at a lower dynamic range to conserve battery life of the mobile communications device 100. Operating the analog-to-digital converter 160 at a second dynamic range may include switching in the second input capacitor 320 and/or the second feedback capacitor 350 (for example, second capacitor) in the sigma-delta modulator 226. As described above, the sample rate and bandwidth controller 234 may control the switching between the first capacitor and the second capacitor. In addition, operating the analog-to-digital converter 160 at the second dynamic range may include reducing the sample rate and reducing the reference voltage of the sigma-delta modulator 226. The automatic gain control state machine 238 automatically adjusts the gain of the receiver portion 200 based on the detected on-channel signal level. For example, the automatic gain control state machine 238 may reduce the gain when a strong on-channel signal is detected. In addition, the automatic gain control state machine 238 may adjust other parameters such as the stochastic resonance, current supplied to the analog-to-digital converter 160 and the like to match the detected on-channel signal level. In some embodiments, the automatic gain control state machine 238 may reduce the bias current applied to the amplifiers 208, 214, 220, 224 (for example, an amplifier) when smaller capacitors (for example, the second capacitor) are used in the sigma-delta modulator 226 to reduce power dissipation. In other words, when the second capacitor is switched in to the sigma-delta modulator 226, the automatic gain control state machine 238 adjusts the bias current of the amplifier 208, 214, 220, 224 in proportion to the second capacitance value.

The method 400 also includes when the receiver electronic processor determines that the on-channel signal level is below the on-channel threshold, causing the analog-to-digital converter 160 to operate at the first dynamic range (at block 460). For example, when the receiver electronic processor determines that the on-channel signal is weak, the analog-to-digital converter 160 is operated at a higher dynamic range. Operating the analog-to-digital converter 160 at the first dynamic range may include switching in the first input capacitor 310 and/or the first feedback capacitor 340 (for example, first capacitor) in the sigma-delta modulator 226. In some embodiments, the switching operation is performed by the electronic processor 110. In addition, operating the analog-to-digital converter 160 at the first dynamic range may include increasing the sample rate and increasing the reference voltage of the sigma-delta modulator 226. The automatic gain control state machine 238 may adjust the on-channel automatic gain control threshold based on the detected on-channel signal level. For example, the automatic gain control state machine 238 may increase the gain thresholds when a weak on-channel signal is detected. In addition, the automatic gain control state machine 238 may adjust other parameters such as the stochastic resonance, current supplied to the analog-to-digital converter 160 and the like to match the detected on-channel signal level.

The method 400 continuously adjusts the dynamic range of the analog-to-digital converter 160 to improve the reception and battery life of the mobile communications device 100. In some embodiments, switching between a high dynamic range and a low dynamic range induces a switching transient noise in a call of the mobile communications device 100. As a consequence, the method 400 may adjust the dynamic range of the analog-to-digital converter 160 during "off-slot" period or during period of silence when the speaker of the mobile communications device 100 is muted. In some embodiments, the method 400 detects that the on-channel signal is weak and that the off-channel interference is high. That is, the off-channel detector 216 may detect a strong undesired off-channel signal. The off-channel detector 216 may provide a signal profile or signal level of the undesired off-channel signal to the RF signal scaling and spur estimator 232. In these situations, the method 400 operates the analog-to-digital converter 160 at a low dynamic range to conserve battery life rather than at a high dynamic range. In these embodiments, the method 400 may operate the analog-to-digital converter 160 similar to the operation based on the on-channel signal level. That is, the method 400 compares the off-channel signal level to an off-channel signal threshold and adjusts the dynamic range of the analog-to-digital converter 160 based on the comparison. However, the off-channel signal threshold may be significantly higher than the on-channel signal threshold. The automatic gain control state machine 238 may adjust other parameters accordingly. In some embodiments, the RF signal scaling and spur estimator 232 may process signals from the on-channel detector 230 and/or the off-channel detector 216 in tandem or individually depending on the specific signal level indication provided. Other techniques may also be used in adjusting the dynamic range of the analog-to-digital converter 160 based on the on-channel signal level and the off-channel signal profile. In some embodiments, the on-channel signal level history and the off-channel signal profile history are stored on the memory 120.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A scalable dynamic range analog-to-digital converter comprising:
    a switched capacitor sigma-delta modulator including:
        a first capacitor having a first capacitance value, and
        a second capacitor having a second capacitance value; and
    a receiver electronic processor that controls a switching operation of the switched capacitor sigma-delta modulator;
    wherein the receiver electronic processor receives an on-channel signal level of an on-channel signal;
    wherein the receiver electronic processor switches in the first capacitor when the on-channel signal level is below an on-channel threshold, and
    wherein the receiver electronic processor switches in the second capacitor when the on-channel signal level is above the on-channel threshold.

2. The scalable dynamic range analog-to-digital converter of claim 1, wherein the receiver electronic processor receives an off-channel signal profile and wherein switching between the first capacitor and the second capacitor is further based on the off-channel signal profile.

3. The scalable dynamic range analog-to-digital converter of claim 1, wherein the first capacitance value is higher than the second capacitance value.

4. A mobile communications device, comprising:
    an internal antenna to receive a radio frequency (RF) signal;
    an on-channel detector coupled to the internal antenna, the on-channel detector configured to detect an on-channel signal level of the radio frequency signal;
    an analog-to-digital converter coupled to the internal antenna to convert the radio frequency signal to a digital signal and including a switched capacitor sigma-delta modulator including:
        a first capacitor having a first capacitance value; and
        a second capacitor having a second capacitance value; and
    a receiver electronic processor that controls a switching operation of the switched capacitor sigma-delta modulator;
    wherein the receiver electronic processor switches in the first capacitor when the on-channel signal level is below an on-channel threshold, and
    wherein the receiver electronic processor switches in the second capacitor when the on-channel signal level is above the on-channel threshold.

5. The mobile communications device of claim 4, further comprising:
    an off-channel detector that detects an off-channel signal profile of the radio frequency signal, wherein switching between the first capacitor and the second capacitor is further based on the off-channel signal profile.

6. The mobile communications device of claim 5, further comprising a memory coupled to the receiver electronic processor and configured to store an on-channel signal level history and an off-channel signal profile history.

7. The mobile communications device of claim 4, wherein the first capacitance value is higher than the second capacitance value.

8. The mobile communications device of claim 4, further comprising an automatic gain control state machine configured to:
    determine whether at least one of the first capacitor and the second capacitor is switched in to the sigma-delta modulator;
    when the first capacitor is switched in to the sigma-delta modulator, adjust a gain of the analog-to-digital converter in proportion to the first capacitance value; and
    when the second capacitor is switched in to the sigma-delta modulator, adjust the gain of the analog-to-digital converter in proportion to the second capacitance value.

9. The mobile communications device of claim 8, further comprising:
    an amplifier coupled between the internal antenna and the analog-to-digital converter; and
    wherein the automatic gain control state machine is further configured to:
        when the first capacitor is switched in to the sigma-delta modulator, adjust a bias current of the amplifier in proportion to the first capacitance value; and
        when the second capacitor is switched in to the sigma-delta modulator, adjust the bias current of the amplifier in proportion to the second capacitance value.

10. A method of scaling a dynamic range of an analog-to-digital converter, the method comprising:
    operating the analog-to-digital converter at a first dynamic range;
    receiving a radio frequency signal;
    detecting an on-channel signal level of the radio frequency signal;
    when the on-channel signal level is above an on-channel threshold, operating the analog-to-digital converter at a second dynamic range; and
    when the on-channel signal level is below the on-channel threshold, operating the analog-to-digital converter at the first dynamic range.

11. The method of claim 10, wherein
    operating the analog-to-digital converter at the first dynamic range comprises switching in a first capacitor of a sigma-delta modulator of the analog-to-digital converter having a first capacitance value, and
    operating the analog-to-digital converter at the second dynamic range comprises switching in a second capacitor of the sigma-delta modulator having a second capacitance value.

12. The method of claim 11, wherein the first capacitance value is higher than the second capacitance value.

13. The method of claim 11, further comprising detecting an off-channel signal profile of the radio frequency signal, wherein operating the analog-to-digital converter at the first dynamic range and the second dynamic range is further based on the off-channel signal profile.

14. The method of claim 13, further comprising adjusting a gain of the analog-to-digital converter based on the on-channel signal level and the off-channel signal profile.

15. The method of claim 14, wherein switching between the first dynamic range and the second dynamic range is performed during an off-slot period.

16. The method of claim 10, wherein operating the analog-to-digital converter at the first dynamic range and the second dynamic range includes adjusting a reference voltage of a sigma-delta modulator of the analog-to-digital converter.

17. The method of claim 10, wherein operating the analog-to-digital converter at the first dynamic range and the second dynamic range includes adjusting a sample rate of a sigma-delta modulator of the analog-to-digital converter.

18. The method of claim 10, wherein operating the analog-to-digital converter at the first dynamic range and the second dynamic range includes adjusting a bias current of an amplifier coupled to the analog-to-digital converter.

\* \* \* \* \*